United States Patent [19]

Stopper

[11] Patent Number: 4,845,315
[45] Date of Patent: Jul. 4, 1989

[54] CABLE SYSTEM

[75] Inventor: Herbert Stopper, Orchard Lake, Mich.

[73] Assignee: Mosaic Systems, Troy, Mich.

[21] Appl. No.: 206,955

[22] Filed: Jun. 9, 1988

Related U.S. Application Data

[63] Continuation of Ser. No. 789,603, Oct. 21, 1985, abandoned, which is a continuation-in-part of Ser. No. 606,324, May 2, 1984, abandoned.

[51] Int. Cl.$^4$ .......................... H01B 7/08; H05K 1/11
[52] U.S. Cl. ............................. 361/428; 174/117 FF; 361/408; 361/413; 361/428; 361/415
[58] Field of Search .................. 174/117 FF, 117 PC; 361/398, 408, 413–428; 439/55, 492, 660–668

[56] References Cited

U.S. PATENT DOCUMENTS

| | | | |
|---|---|---|---|
| 3,039,177 | 6/1962 | Burdett | 29/848 |
| 3,093,805 | 6/1963 | Osifchin et al. | 174/117 PC |
| 3,391,246 | 7/1968 | Freeman et al. | 174/117 FF |
| 3,629,787 | 12/1971 | Wilson | 361/408 X |
| 3,727,168 | 4/1973 | Henschen | 439/498 |
| 3,749,959 | 7/1973 | Schmersal et al. | 174/117 PC |
| 3,808,505 | 4/1974 | Reimer | 361/413 |
| 3,818,122 | 6/1974 | Luetzow | 174/117 FF X |
| 3,878,341 | 4/1975 | Balde | 174/117 FF X |
| 3,895,435 | 7/1975 | Turner et al. | 174/117 PC X |
| 3,979,763 | 9/1976 | Mills | 339/17 F X |
| 4,060,889 | 12/1977 | Zielinski | 174/117 PC X |
| 4,065,199 | 12/1977 | Andre et al. | 339/17 F |
| 4,130,723 | 12/1978 | Wakeling | 174/117 PC X |
| 4,237,546 | 12/1980 | Wells | 361/413 |
| 4,435,614 | 3/1984 | McAusland | 174/117 PC |

FOREIGN PATENT DOCUMENTS

| | | | |
|---|---|---|---|
| 836504 | 4/1952 | Fed. Rep. of Germany | 339/17 F |
| 2622082 | 11/1977 | Fed. Rep. of Germany | 174/117 FF |

OTHER PUBLICATIONS

Ferraro, A. J. et al; PC Cable with Epoxy-Glass Substrate; IBM Technical Disclosure Bulletin; vol. 26, No. 8; Jan. 1978.

Dupont Technical Bulletin M-97; Printed Circuits and Flat Cable; Jun. 22, 1970.

*Primary Examiner*—Morris H. Nimmo
*Attorney, Agent, or Firm*—Harness, Dickey & Pierce

[57] ABSTRACT

A computer and switching mainframe connection system and flat cable connection elements therefor. The elements are a flat cable "S" circuit, FIG. 1, and a bus circuit, FIG. 8. The "S" circuit has an elongated run (68) and a "S" portion (43). The bus circuit has "U" elements (61) and a linear portion (58) with the signal lines of the "U" elements (61) connected to the signal lines of the bus circuit (80). The mainframe is formed of an array of circuit boards (100) bearing a wafer (90) and header (99) for the wafer which in turn is connected to ports (101) to which tab connectors (57, 56, FIG. 3) of the bus circuit and "S" circuit are connected.

8 Claims, 6 Drawing Sheets

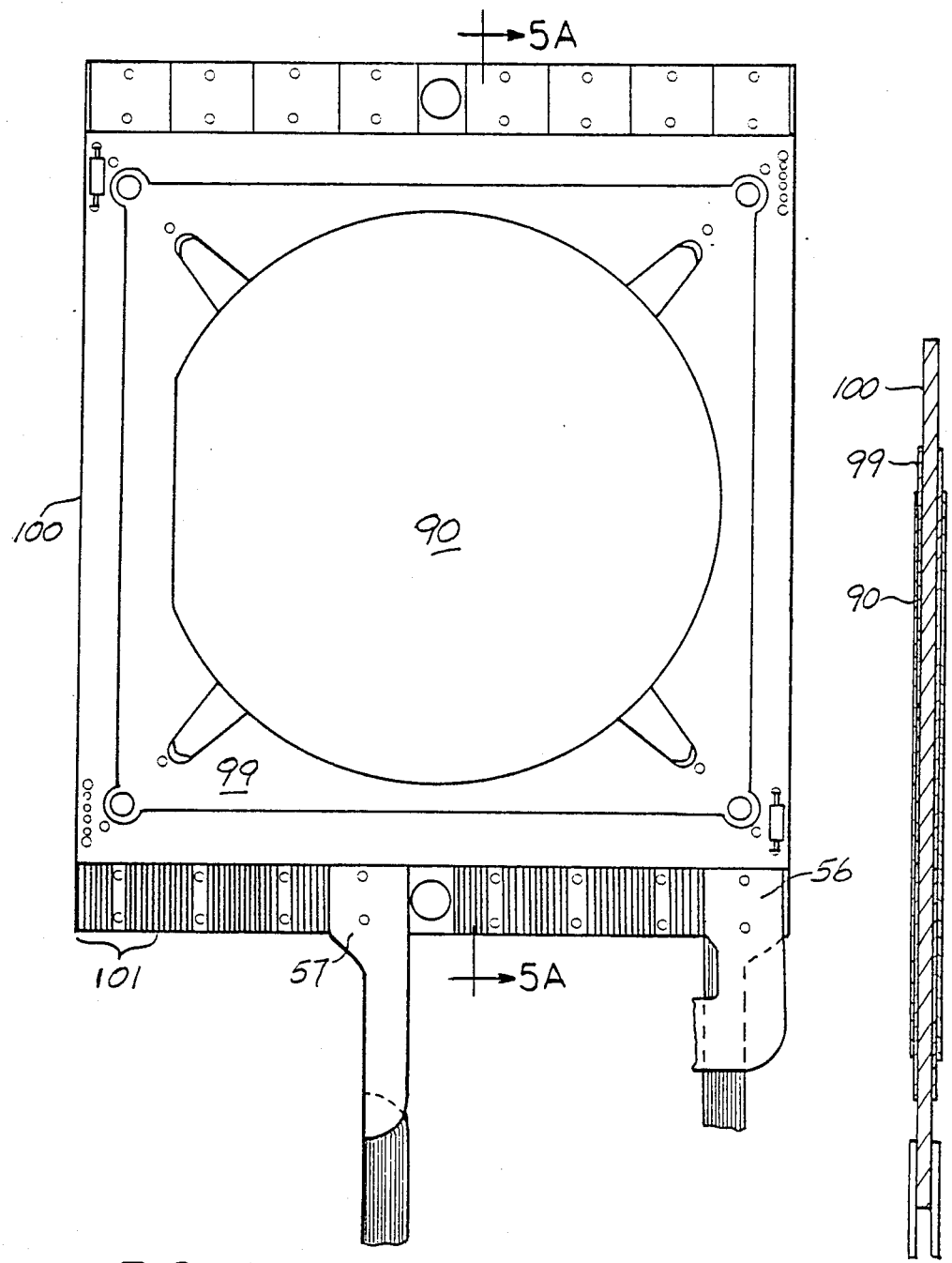

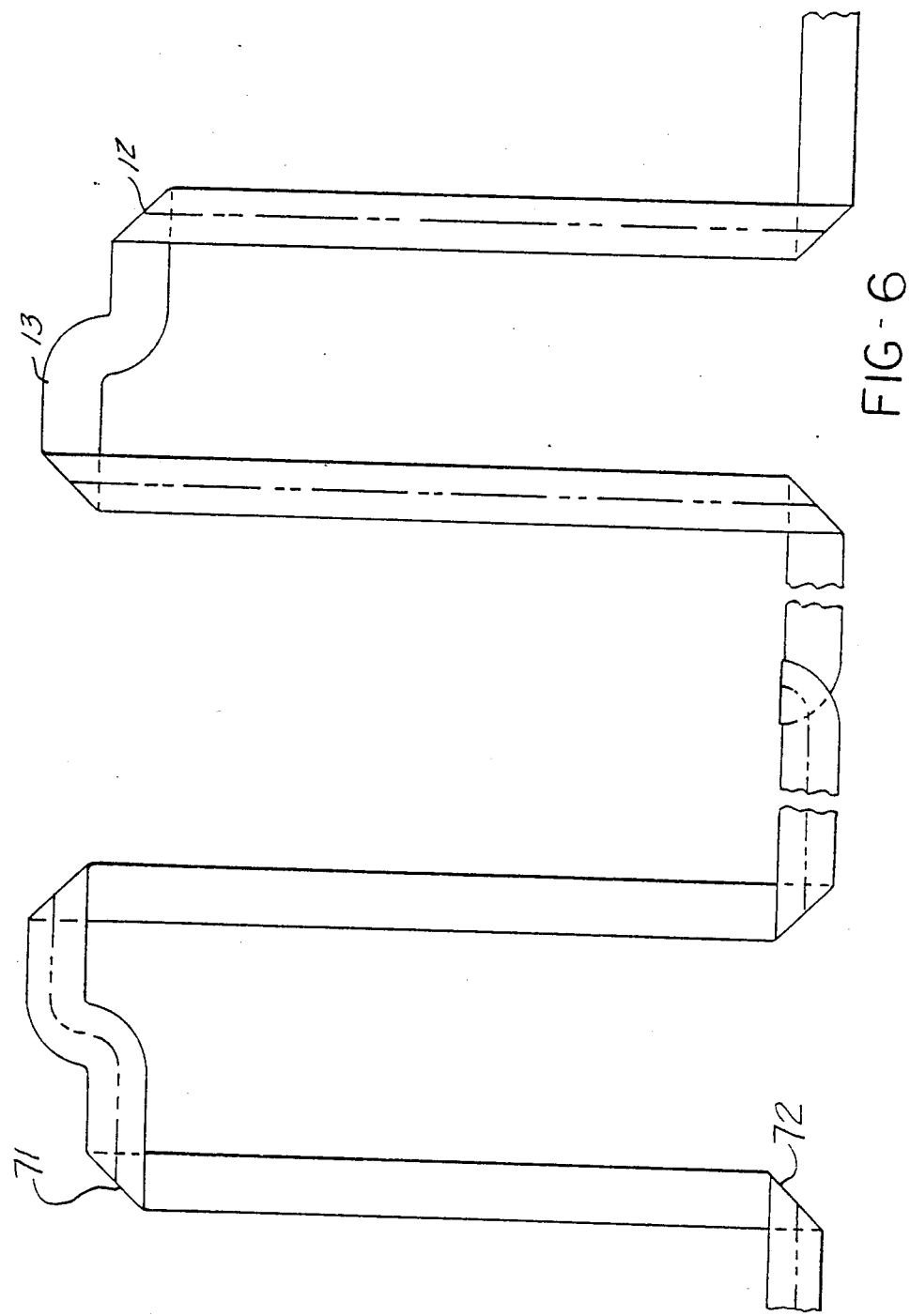

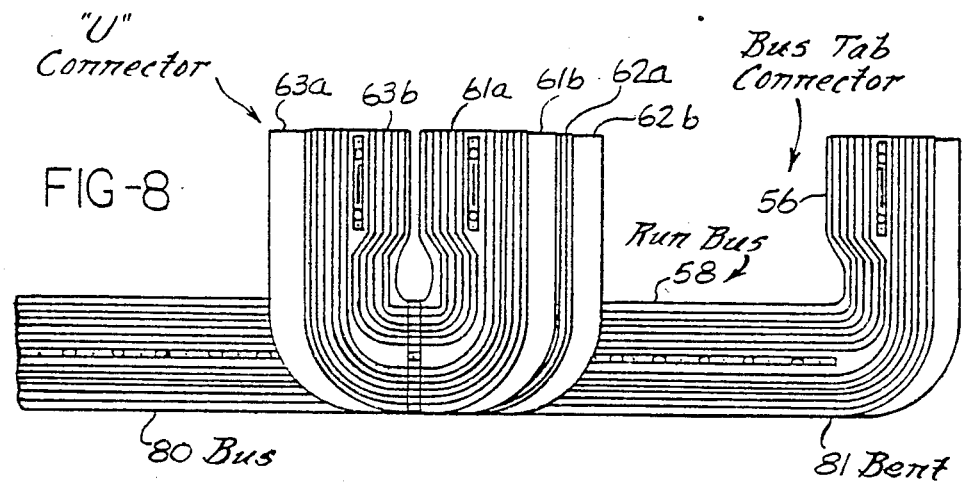
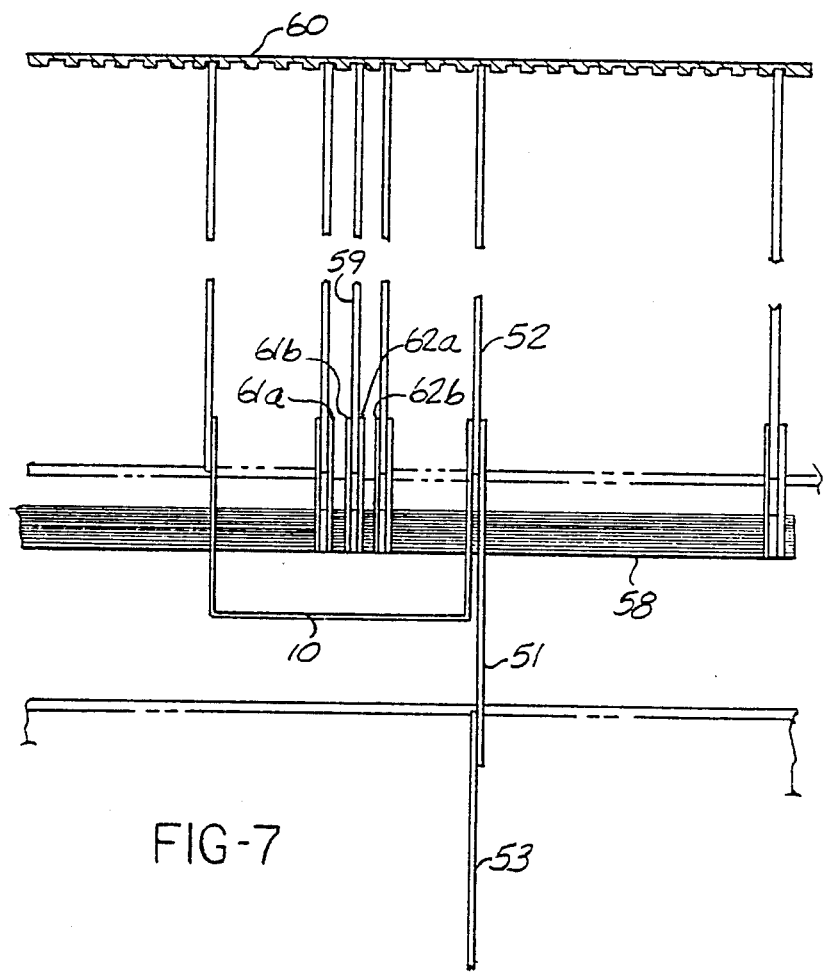

CABLE SYSTEM

This is a continuation of U.S. patent application Ser. No. 789,603, filed Oct. 21, 1985 now abandoned, which is a continuation in part of U.S. patent application Ser. No. 606,324, filed May 2, 1984, now abandoned.

TECHNICAL FIELD

This invention relates to a flat flexible circuit cable system for interconnection of printed circuit boards, as is done in mainframes of computers and switching systems.

BACKGROUND ART

The prior art in this field utilizes flat cables to connect parallel ports at the edge of the board if the array is simple in a manner similar to that used to connect lines similar to those of gaseous display panels, but normally "spaghetti" wiring is used. However, it is known to use long flat cables that can be twisted while the parallel lines of the cable are maintained in parallel. Such flat cables use a connector at the end to connect to connectors at a plug, or they can be soldered to make a connection.

In the prior art, U.S. Pat. No. 4,878,341 granted Apr. 15, 1975 shows a flat straight cable which is twisted to form an interstage linkage for a switching network. This is illustrative of the utilization of straight flat cables for connection. The flat straight cable, shown by U.S. Pat. No. 3,749,959 to Schmersal et al, granted July 31, 1973, and U.S. Pat. No. 3,391,246 to Freeman et al, granted July 2, 1968 has been twisted to form a desired connection. In addition there have been special configurations of clad cables disclosed by U.S. Pat. No. 3,818,122 to Luetzow, granted June 24, 1974 which have a unique configuration which permits opposed end segments of the assembly to be twisted relative to each other so a to achieve a plurality of independent helices which proved a flexural plane for relative motion between assemblies to which the ends are connected. Dupont (Trademark of E. I. Du Pont de Nemours & Co. (Inc.)) Technical bulletin M-97, Printed Circuits and Flat Cable; June 22, 1970 illustrates a flexible printed circuit and flat cable (like the above patents) on Mylar. There are many other patents which could be cited in the prior art, as this particular art is a field in which such development work has occurred. For instance, U.S. Pat. No. 4,060,889 to Zielinksi, granted Dec. 6, 1977 shows how a flexible electrical circuit connection can be made to gas discharge panels or boards, while U.S. Pat. No. 3,629,787 to Wilson, granted Dec. 21, 1971 shows how they can be connected to each other and to circuit boards. Now the DuPont suggested commercial devices shown by bulletin M-97 do not suggest ground planes or ground conductors, But there are patents like the U.S. Pat. No. 3,039,177 to Burdett, granted June, 1962 and 3,093,805 to Osifchin et al which were then known, and U.S. Pat. No. 4,130,723 to Wakeling, granted Dec. 19, 1978 issued after the bulletin M-97 which show circuit, including multilyaer circuit boards. This latter patent shows the use of signal lines and ground lines or tracks alternating in order and having the opposite face of the circuit having likewise matching alternating ground lines and signal lines, so as to minimize cross talks on data paths. U.S. Pat. No. 3,749,959 previously mentioned shows pairs of flexible straight cables connected to a panel. While not in a flexible cable system, it is also known to plate through holes to interconnect layers of a multilayer device, as illustrated by U.S. Pat. No. 3,895,435 to Turner et al, granted July 22, 1975. In the art of flexible cable U.S. Pat. No. 4,435,614 to McAusland, granted Mar. 6, 1984 and filed Feb. 28, 1983, showed a method of making a long flexible printed circuit board cable by starting with a pattern which has a series of slits separating two parallel cable patterns which are connected to each other by lines which bend by 90 degrees twice to form a U, and the pattern is folded and glued to form an elongated cable having a transducer mount in the center of the cable. German Patent Publication (Deutsche Auslegeschrift) No. 26 22 082 shows a flat ribbon type cable on a plastic foil base being folded with a succession of pleats coinciding with cable run corners to give sideways flexibility and to retain that permanently by heating sealing the fold. U.S. Pat. No. 3,979,763 to Mills, granted Sept. 1976 also shows a flexible circuit and IBM Technical Disclosure Bulletin Vol. 20, No. 8 (1978) shows still another variety of flat printed circuit cable which uses epoxy-glass as a substrate to maintain cross section stability while allowing bending deviation of the cable along its length from a normal straight line.

SUMMARY OF THE INVENTION

Broadly, an interframeboard connection system is provided by a universal "S" cable circuit which allows connection of parallel ports of parllel board frame to one another and which accommodates connection of ports which are on the same board but on the opposite side to another parallel board, or to another port on the same board as in a laterally displaced position on the opposite side or same side of the same board by permitting bending of the cable circuit at an "S" position. More particularly, I have provided a cable system, which includes a flat "S" cable circuit and interrelated bus system, which allows flat cables having parallel signal lines to be used together to reduce the individual wiring connections between signal lines of mainframe or switching configuration especially in an environment which is of low temperature which permits a compact configuration of parallel frameboards and yet reduces breakage by allowing bending about centers which have radiuses of approximately 0.5 centimeters. The bus system allows interconnections of parallel ports of the boards while the "S" cable circuit permits serial interconnection of different and linearly spaced apart ports of the frame boards. The basic "S" pattern can be modified with additional "S" configurations to permit a greater displacement of the ports in the unit. In these mainframe switching systems, a plurality of circuit boards are arrayed in parallel planes, and there are usually several arrays of circuit boards in parallel arrays. The "S" cable circuit enables compaction of the circuitry, and the utilization of such circuits allows advance calculation of the position of various circuit components in the system, assisting in system development, and providing a system wherein specific cable interconnections can be schematically represented.

A full understanding of the various inventions and their different aspects will be had by review of the following description and the accompanying detailed drawings in which:

FIG. 1, shown as FIGS. 1A, 1B, 1C, 1D, 1E and 1F illustrates the basic cable of the system, with :

FIG. 1A showing one top side,

FIG. 1B showing one bottom side, and

FIG. 1C showing FIG. 1A folded or twisted over in the middle, so as to show the bottom of the cable on the right side of the FIG. 1C; while, FIG. 1D, shows the FIG. 1B orientation of the cable of FIG. 1 folded or twisted over in the middle so that the top side shows at the right of FIG. 1D.

FIG. 1E shows the FIG. 1C cable twisted further in the area near the middle of one half of its length, while.

FIG. 2A shows an alternate cable configuration which is a elaboration of the cable of FIG. 1, while

FIG. 5 shows how the cables can be connected to the board with a header system, while FIG. 5A shows how top connections can be made to the same board with the header system.

FIG. 6 shows an elongated cable using the basic cable circuit.

FIG. 7 shows an array of boards in a mainframe cage or frame aligned in an array with a bus interconnection along one port line, and a second array in parallel to the first array, as is normal in mainframe configurations.

FIG. 8 is a plan view of a bus used in FIG. 7.

DESCRIPTION OF THE PREFERRED EMBODIMENTS

Figure 1A:
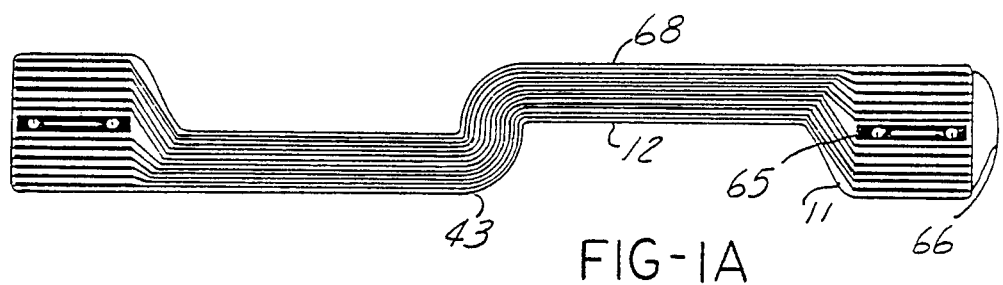
Figure 1B:
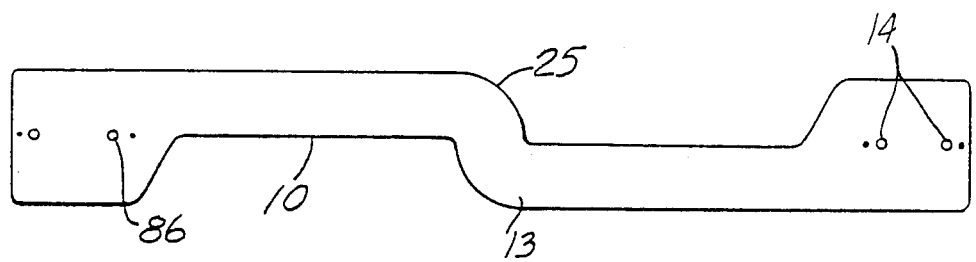

Turning now the the drawing in greater detail, it will be seen that the cable shown by FIG. 1, in its top and bottom views, FIGS. 1A and 1B respectively, can be understood to the the basic flexible cable circuit. A greater understanding can be had by review of the FIGS. 1A through 1F with a view in mind as to the orientation of the lines of the basic cable which is a basic "S" orientation of signal runs on the top side FIG. 1A, where all parallel signal lines, illustrated by lines 11 and 12 run. On the opposite side, is a ground plane 13, located on the back or bottom side of the basic "S" or parallel signal cable. The ground plane 13 is connected to the top side of the flexible circuit by planting through hole 14.

The basic "S" cable circuit has a predetermined width and length. The circuit has twelve signal lines which run in a generally parallel direction along the length of the cable circuit. At either end of the circuit is a bonding connector tab end shown in FIG. 3 which defines the width of the flexible cable circuit and at approximately the center of the length of the cable circuit there is an "S" which separates the circuit into two halves and which causes the twelve signal lines to turn 90 degrees, travel a distance in a direction generally normal to the length of the cable circuit, then turn again 90 degrees such that the signal lines of the circuit continue to run on the substrate in the original direction of travel along the length of the cable circuit to the other tab end of the circuit, and such that the circuit if bent in the middle would have to side runs which are separated in space to allow passage of a thin parallel circuit in a plane through an aperture of the bent cable circuit, as will be observed by reference to the drawings and following description. The signal line face of the "S" cable circuit at the tab end has a grounding surface on the signal face and a ground plane on the back surface which covers substantially the same area as the surface covered by all of the signal lines and the spaces therebetween on the top surface of the cable circuit.

Figure 1C:
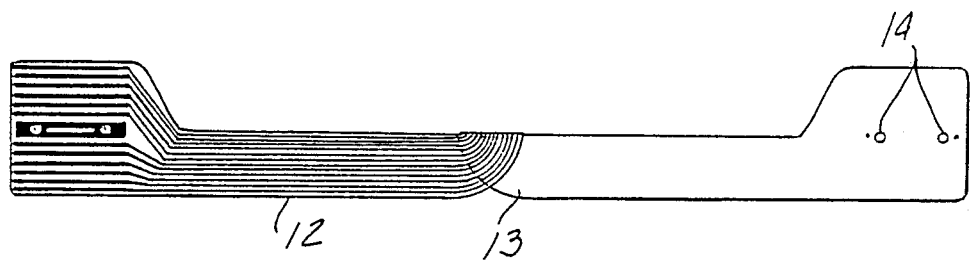

The flexible "S" cable circuit is used in various ways to make a connection from plane to place, and the FIGS. 1C though 1F show how one can modify the standard part shown in FIGS. 1A and 1B by flipping, turning, folding and bendings the device.

Figure 1D:
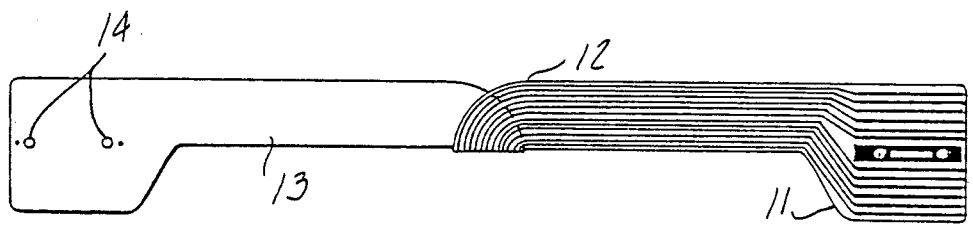

FIGS. 1C and 1D are respectively a bend of FIG. 1A and FIG. 1B, giving two different orientations to the cable.

An illustration of the section which is too small to be shown in the patent drawings without substantial enlargement which is not needed would show that the signal lines and ground plane are coated on the top and bottom side of the "Mylar"("Mylar" is a trademark for polyester film which is sold by E. I. DuPont de Nemours & Co., Wilmington, Del., U.S.A.). The ground plane is on the back of the cable circuit and has a board connection for ground on the signal side, achieved by plating through a hole formed in the polyester film which forms a substrate for the parallel signal lines and the ground plane. This connection can be seen at 65 in FIG. 1A. Orientation holes 14 are placed thorugh the "S" cable circuit for mechanical orientation of the elements of the system.

Figure 1E:
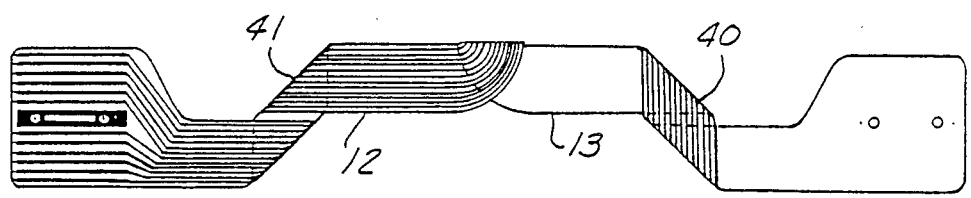
Figure 1F:
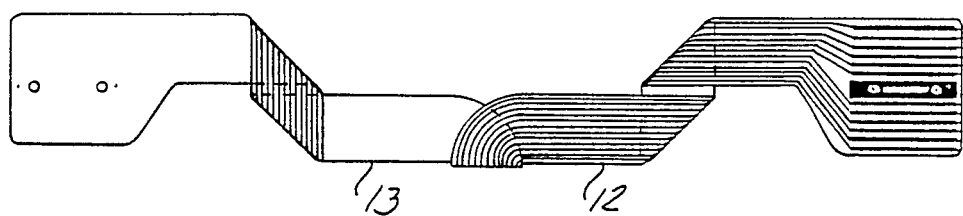
FIG. 1F shows the FIG. 1D cable twisted further in the area near the middle of one half of its length to give another view of the FIG. 1 cable.

In order to use the cable in a variety of positions sidewise or lateral displacement can be achieved over a wide turning radius. This can be accomplished as is shown in FIG. 1E and 1F. There is illustrated for simplicity how a turn for sidewise displacement can be achieved by turning the cable about a radius, as around a pencil.

While the surface of the copper can be coated to protect it at desired places against elements, the basic "S" cable has a section which will show copper, "Mylar" (or other flexible dielectric film having similar characteristics), and copper.

Figure 2A:
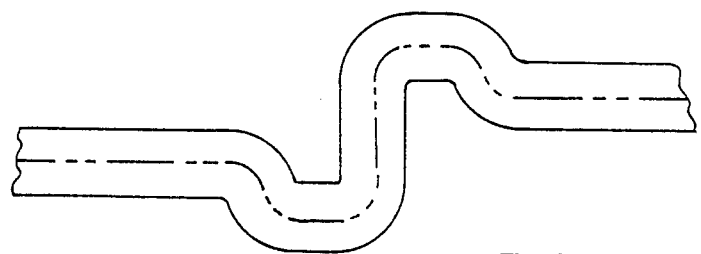
Figure 2B:
FIG. 2B shows the FIG. 2A cable in a folded or twisted configuration.

With the basic "S" flexible cable you can connect between two lanes as well as jump over with sideways displacement. This is facilitated in some by a double "S" configuration, as shown in FIG. 2, with FIG. 2A showing the basic configuration and FIG. 2B showing the twisted configuration. FIG. 6 shows how a really long cable can be made with a triple "S" configuration, in order to obtain a very large displacement.

Figure 4:
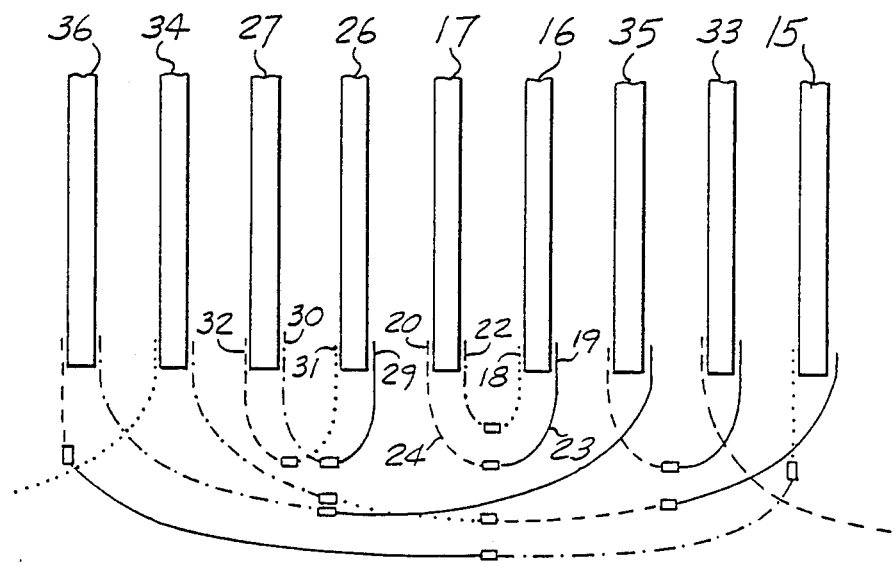
FIG. 4 shows how several printed circuit boards are able to be connected with the basic cable in a closely packed system such as the illustrated mainframe cage shown in side view.

Mainframe boards 15 are shown in FIG. 4, closely packed in a mainframe board cage, shown in a side view.

FIG. 5 shows how the board of the so called frame connection is made, with FIG. 5a showing a cross sectional view of FIG. 5. The header for the frame board is mounted on it, and the leads from the header connect the circuitry of the system to eight ports on either endside of the frame board. In the preferred embodiment each endside has four ports on each lateral portion of each side of each face of the board. Thus the board is symetrical and it can be flipped over and the view from the top and the bottom would be the same. The contacts can be made to both side of the board as shown by the section of FIG. 5A. These eight ports to an endside are the contract points.

These ports have lines on them which match the pattern of contacts of the cable, so that a cable can be pressed against the port and contact made. The actual contact mechanism could be by bonding accomplished by a press contact, by solder, by ultrasonic bonding, or other techniques which are used in the industry.

It will be seen from FIG. 4 that the frame boards are arranged in a stack. The view of FIG. 4 is an end view sketch which is and end edge view of a plurality of of frame boards. The view is of a portion of a plurality of the boards of FIG. 5, as shown in FIG. 5A, which permits connections to be made to the ports at the bottom edge (or as is not shown the top edge) of the frame boards which make up the mainframe. As seen in FIG. 4 there is illustrated schematically how the same "S" cable can be made to run from port to port. Consider the port to port connection as one to be made, and the connection would be a "highway" having two lanes, a signal lane (one) and a ground lane (zero). In order to explain how the "funny" shapes solve the problem of various principal interconnections which are needed, in FIG. 4 dotted lines have been drawn to be the zero or ground side up on the right side and dot-dash on the left to indicate ground side up, while solid lines (and dashes) represent signal side up on the right side. This schematic will illustrate, in a simple side view, whether one is in the "same lane" or a "different lane", and thus enable one to determine from the sketch whether there is a conflict or not. In the drawings rectangles represent the position of the "S" configuration. For schematic representation a blackened or filled rectangle could represent a "S" which is bent over as a cross over. Cross overs are represented by the rectangles, each cross over point could represent a twist, fold or bend of the basic cable. The point to be understood here is that the lane point should allow a lane of the one cable to not compete for space of a lane of another cable. The lane or run because of the configuration allows two cables to be connected to the same port position on the board, albeit to the opposite sides of the port position so as to actually connect to two ports. Thus board 16 is connected to board 17 at two locations, right port 19 of board 16 is connected to left port 20 of board 17 with a cable which has its signal lines face up as shown in FIG. 1A. without any folding at the square or "S" bend point such that the right side of solid line corresponds to the right side of FIG. 1A while the left dashed line corresponds to the left side of FIG. 1A. On the other hand the left port 18 of board 16 is connected to the right port of board 17 by a cable connection which would appear as FIG. 1B without being bent up to make the connection which is shown in FIG. 4. When it is bent up but without any fold at the "S" bend point 25 (See FIG. 2) the connection of signal line of the cable to signal line of the board is made at point 22 for the right port of board 17 and at 18 for the left port of board 16. By convention, the dots correspond to the right portion of the FIG. 2, while Dot-dash corresponds to the left hand of FIG. 2.

On the other hand, the right port 29 of board 26 is connected to the right port 30 of board 27 by a configuration corresponding to FIG. 1D, with the right side corresponding to the solid line, and the dot-dash corresponding to the left side. Similarly, left port 31 of board 26 is connected to left port 32 of board 27 by a cable configuration corresponding to FIG. 1C. By following the convention just described, it will be observed that a configuration corresponding to FIG. 1A connects board 33 to board 35 while a configuration corresponding to FIG. 1D connects board 35 with board 36. In this manner, even rolling, the necessary non-interfering connection between ports can be made. Similar, and shorted connections can be made by following the roll which folds the cable configuration five times, as shown in FIG. 1E and FIG. 1F., however, this will enable the connection to be shortened, or the length of the cable reduced to accommodate close quarters. When folding five times what is really meant is that two "folds" mean a 360 degree bend or twist, while a single "fold" is a bend of 180 degrees. In the drawing of FIG. 4, it will be appreciated that three squares correspond to a drawing corresponding to a center fold, as well as bends like 40 and 41. For simplicity, the squares are not filled, but it will be seen that board 15 can connected to board 36 by a configuration like that shown in FIG. 1E, while board 16 is connected to board 34 by the configuration shown in FIG. 1F.

In connection with FIG. 1E and FIG. 1F it should be noted that should the fold of FIG. 1E be made in the opposite direction is likewise possible, and a short or tight double fold or bend as shown at 40 could be made long so as to achieve an offset of one end from the other end, so as to connect the third port of one board with a fourth port of another board, if desired. This possibility is increased with the configuration shown in FIG. 2 and FIG. 6.

Figure 3:
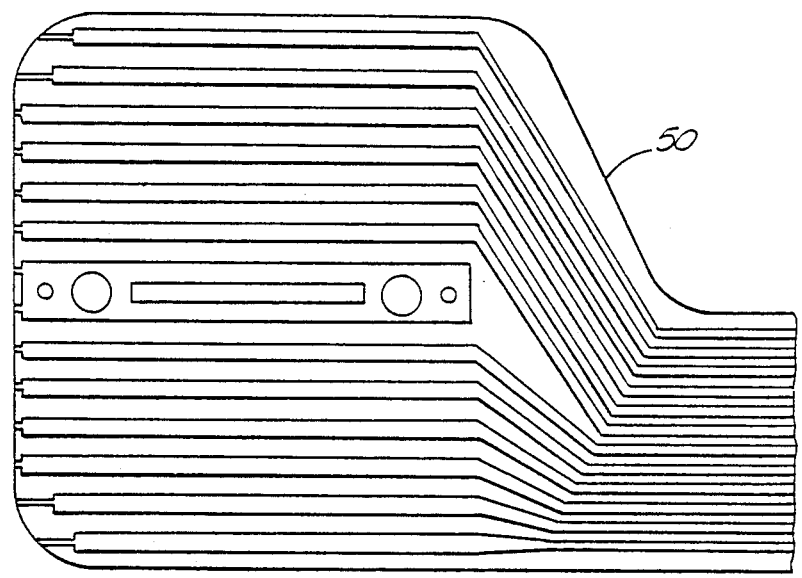
FIG. 3 shows a detail of the connector edge of FIG. 1A.

Understand that the fold of a sharp bend like that shown by folding paper to reach the illustrated designs, would not be suitable for actual practice. It should be a bend and not a hard fold, as has been represented in certain prior art illustrations. The object is to make a cable connection which will accommodate various temperatures, and especially temperatures which will reach that of liquid Freon (another DuPont trademark), and that of liquid nitrogen or the temperature of a vapor area above liquid nitrogen, nearly −196 degrees Celsius. At these temperature sharp bends of "Mylar" snap. The "S" cross over 25 has two turns which cause a displacement of the parallel signal lines 43 from a first position to a second parallel position, achieved by a 90 degree turn in a first direction from a longitudinal direction toward the center on the plane of the cable and then another 90 degree turn in a second direction back along the longitudinal direction of the plane of the cable. The end connections are spread apart so that each end connector portion of the cable 50, as seen in FIG. 3 is wider than the main portion of the cable's length, actually twice the length so that the "run" portion of the cable is sufficiently less than half the width of the cable, such that at least one cable can pass sideway through two cables which are connected to the same port number on opposite sides of the circuit board as shown in FIG. 4 and 5A. That is to say that each side of the highway is slightly displaced so that a thin "Mylar" flexible cable can pass sideways through the small gap.

Referring to FIG. 5, it will be seen that an "S" cable 10 passes in a depending (or on the opposite end-appending) fashion from the board to make a connection to another board port, as shown in FIG. 4, and a somewhat exaggerated sharp bend shown in FIG. 7 shows such a connection between two boards, like FIG. 1B. Another "S" cable 51 depends from the same board 52 to connect to another board 53 in another cage of the mainframe. This cable 51 would be like the FIG. 1A, and thus there would be space between the two "S" cables permitting a bus, as shown in FIG. 5 and FIG. 7 and FIG. 8 to pass through the two highways to interconnect in a bus fashion two ports.

Referring now to FIG. 5, the bus tab connector 56 is configured like the "S" cable tab connector 57, as seen in FIG. 5 and FIG. 3 so as to match the signal connection points for pressure, bonded or solder connection thereto. As shown in FIG. 5A the board of the system has opposed ports on the edge one on each side for connection to a wafer 90 bonded to a header 99 which in turn is connection to eight ports (like 101), four to a side of two edges of the board 100. This increases the permissible density of circuitry of the mainframe switching system, but complicates the overall connection problems which the reason for development of the cable and bus system of the present preferred embodiments.

The bus of the system has several "U" circuits which are bonded to it.

Each "U" circuit contains twelve signal line and a ground surface on one face thereof and a ground plane on the opposite side thereof. Each "U" circuit is connected to the linear bus by having each of its signal lines bonded to a corresponding signal line of a linear bus connector circuit with the connection being made either by soldering, or other bonding technique as is known in the art. The bus is shown in FIG. 8.

Referring to FIGS. 7 and 8, the bus has a bus run 58, which is defined to be that part of the bus which traverses a frame cage such as 60 in FIG. 8. The bus can run beneath or above the frame boards in the frame cages, such as 60, and can be bent along any line 81 normal to the original direction of travel in order to permit bus tab connectors of the bonded "U" circuits to connect to the ports of boards, such as 59 in FIG. 8, within the frame cages. The bus is similar to the parallel flexible cables of the prior art, but it has on the surface parallel signal lines which can be made to connect to opposing signal lines of a "U" circuit of which several are illustrated in FIGS. 7 and 8. For example, circuits 61a and 61b, as shown in FIG. 7, represent two symmetrical circuit halves of a single "U" circuit. Similarly, circuits 62a and 62b as well as circuits 63a and 63b, as shown in FIG. 7, also represent symmetrical halves of single "U" circuits. To bond the "U" circuits to the bus the "U" circuits have their signal sides facing the bus. The "U" circuits can be connected to the bus by soldering or other bonding technique, such as ultrasonic bonding. After bonding, each symmetric half of the bonded "U" circuit may be independently moved, around a line defined by the points of bonding, in order to effectuate connections to a board such as 59 in FIG. 7

For example, the "U" circuit comprised of circuits 61a and 61b, as shown in FIG. 8, is shown to have circuit 61a bent away from bus 80 after bonding has been accomplished. Circuit 61b is shown to be in its initial (pre-bonding) position. Similarly, the "U" circuit comprised of circuits 63a and 63b is shown in FIG. 8 as having circuit 63b bent away from bus 80 after its corresponding "U" circuit has been bonded. "U" circuits are placed on the bus in a spaced apart relationship as are "U" circuits 61, comprised of circuits 61a and 61b, and 63, comprised of circuits 63a and 63b, as seen in FIG. 8. The bus is normally used to interconnect ports of boards in the frame which are oriented in an array with their planes in parallel and normal to the direction of the mainframe array, which direction is defined as the direction in which the frame cages are aligned, as shown in FIG. 7. Like the cable circuit and "U" and bus circuits have twelve signal lines aligned in parallel. They also have a ground plane on the back side of the polyester film substrate. The ground plane is on the back of the bus "U" circuits and has a board connection for ground on the signal side, achieved by plating through a hole formed in the polyester film which forms a substrate for the parallel signal lines and the ground plane. This connection is like the one which can be seen at 65 in FIG. 1A. Orientation holes are placed through the bus at various points along its linear extent for mechanical orientation of the elements of the system. Orientation holes are also placed through the "U" circuit in the same manner as they are for the "S" circuit as shown in FIG. 1B.

The illustrated system is a rectangular (in cross section) substitute for the so called spaghetti wiring often found in mainframe connection. Spaghetti wiring can be bent in all directions, but rectangles can be reliably bent only in one direction, as shown. However, the configuration of the "S" cable and its interaction with the bus interconnection enables achievement of the flexibility of spaghetti wiring, and yet maintains the coordinate control and wiring ease characteristic of normal straight parallel flexible cable.

The normal width of a "S" cable tab connector shown in FIG. 3 and FIG. 1 is 14.4 millimeter and the width of the bus tab connector circuit 66 consisting of twelve signal lines and one ground connection 65 is 13.6 millimeters, so that a nominal width of the run 68 (See FIG. 1A), thus the run can have a nominal width not quite equaling 7.2 millimeters, and is actually slightly narrower, say on the order of 7.0 millimeters.

The longer connections can be made by the configuration shown in FIG. 6 wherein three "S" bends are provided, and great displacement can be achieved. There it will be seen that in the event bends 71 and 72 are not made, the surface connections will be the same as those illustrated, however there will be a substantial lateral displacement of the tab connector so that a different port on a board can be accessed, or so that one port on a laterally and vertically displace board, as may be envisioned by reference to FIG. 7 can be achieved.

By combining the "S" cable connectors, with the bus connectors and the "U" bus connectors shown in FIG. 7, a mainframe composed of several frame cages can be interconnected, not only by a bus connection, but randomly, from one port on one board of the frame to a corresponding or different port on the same or another board on the same frame.

INDUSTRIAL APPLICABILITY

The invention is applicable to the electronic industry for connecting printed circuit boards in an array. The invention permits closely packed arrays of boards in a low temperature environment. The uses of the invention may be expanded to other specific allications by the use of specific circuit elements disclosed herein.

While there has been described the preferred and alternate preferred embodiments of the "S" cable circuit and the bus circuit with "U" connectors, various modifications and rearrangements of the disclosure will now occur to those skilled in the art of flat cable designers, both now and in the future, and such modifications to the extent warranted by the advances herein made are to be deemed included within the scope of the appended claims. The claimed inventions thus may be practiced or embodied in other ways without departing from the essential character thereof.

What is claimed is:

1. A flat cable circuit comprising a long flexible printed circuit comprising:

a base substrate of dielectric flexible film and a signal circuit pattern formed on one top surface thereon in the form of substantially parallel signal lines and a ground circuit pattern formed on a second bottom surface thereof, the signal pattern comprising at least two substantially elongated run sections joined by a perpendicular section which can be bent to change the orientation of the lines of the signal patterns characterized by, a "S" cable circuit pattern which has a predetermined width and length, and which has a plurality of signal lines which run in a generally parallel direction along the length of the cable circuit, the cable circuit having at each end of the circuit a bonding connector tab end which defines the width of the flexible cable circuit and at approximately the center of the length of the cable circuit there is an "S" which separates the circuit into two halves each forming an elongated run section and which causes the signal lines to turn in the perpendicular direction, travel a distance in a direction generally normal to the length of the cable circuit, then turn again in a perpendicular direction such that the signal lines of the circuit continue to run on the substrate in the original direction of travel along the length of the cable circuit to the other tab end of the circuit, and such that the circuit in each elongated run section is narrower and less than one half of the width of the tab ends to allow passage of a thin parallel circuit in a plane through an aperture of two identical opposed cable circuits, and wherein signal line face of the "S" patterned cable circuit at the tab ends has a grounding surface on the signal face and a ground plane on the back surface which covers substantially the same area as the surface covered by all of the signal lines and the spaces therebetween on the top surface of the cable circuit.

2. An interframe board connection system comprising:

a universal "S" cable circuit having a "S" position within its length which allows connection of ports of boards which reside in a board frame to ports of other boards which may reside in different board frames where the different board frames are parallel to each other and which also accommodates connection of ports which are on the same board but on the opposite board side to ports of another board which is parallel to it, or to another port on the same board by permitting bending of the cable circuit at said "S" position, the said "S" position of the cable circuit being a portion thereof which causes substantially parallel signal lines of the cable circuit to run perpendicular to their line of normal travel along the length of the cable circuit for a short distance and then change direction to return to their line of normal travel to define a run of parallel signal lines which is displaced from the original run of parallel signal lines and wherein there is a portion of the length of the cable circuit on either side of the "S" position which is narrower than one half the width of the circuit to permit two like "S" cable circuits which are in parallel planes to pass a flexible flat cable through a slit or window and such that the two opposed circuits may interconnect ports of one or more circuit boards in parallel planes to one another without interference.

3. A flexible flat cable bus connector circuit comprising:

a linear bus circuit, which may be used in a board frame assembly comprising a plurality of frame cages each containing a plurality of frame boards, having a flat flexible substrate and having a plurality of parallel signal lines formed on a top surface thereof, a "U" circuit comprised of at least two bus tab connectors interconnected by a flexible circuit thereby forming a "U-shaped" circuit, wherein said flexible circuit contains, a plurality of signal lines and a ground surface on one face thereof and a ground plane on the opposite side thereof, each signal line of the "U" circuit being bonded to a corresponding signal line of the linear bus circuit to form the connector circuit.

4. A linear bus connector circuit according to claim 3 with sufficient flexibility to permit the bus tab connectors of a "U" circuit which is connected to said linear bus to rise to connect to ports of boards of the board frame assembly.

5. A flat cable circuit according to claim 1 wherein there are a plurality and odd number of "S" sections formed along the length of the circuit adapted to permit displacement of the tab connector ends when the ends are connected to circuit boards to form an interconnected system.

6. A connection system according to claim 1 wherein there is provided a plurality of universal "S" cable circuits each of which comprises:

a base substrate of dielectric flexible film and a signal circuit pattern formed on one top surface thereon in the form of substantially parallel signal lines and a ground plane formed on a second bottom surface thereof, the signal pattern comprising at least two substantially elongated run sections joined by a perpendicular section forming the "S" position which can be bent to change the orientation of the lines of the signal patterns characterized by, a "S" cable circuit pattern which has a predefined width and length, and which has a plurality of signal lines which run in a generally parallel direction along the length of the cable circuit, the cable circuit having at each end of the circuit a bonding connector tab end which defines the width of the flexible cable circuit and at approximately the center of the length of the cable circuit there is an "S" which separates the circuit into two halves each forming an elongated run section and which causes the signal lines to turn in the perpendicular direction, travel a distance in a direction generally normal to the length of the cable circuit, then turn again in a perpendicular direction such that the signal lines of the circuit continue to run on the substrate in the original direction of travel along the length of the cable circuit to the other tab end of the circuit, and such that the circuit in the elongated run section is narrower and less than one half of the width of the tab ends to allow passage of a thin parallel circuit in a plane through an aperture of two identical opposed cable circuits, and wherein the signal line surface of the "S" cable circuit at the tab ends has a grounding portion on the signal line surface and a ground plane on the back surface which covers substantially the same area as the surface covered by all of the signal lines and the spaces therebetween on the top surface of the cable circuit.

7. A connection system according to claim 6 further including a flexible flat cable bus connector circuit comprising:
- a linear bus circuit having a flat flexible substrate and having a plurality of parallel signal lines formed on a top surface thereof,
- a "U" circuit comprised of at least two bus tab connectors interconnected by a flexible circuit thereby forming a "U-shaped" circuit, wherein said flexible circuit contains a plurality of signal lines and a ground surface on one face thereof and a ground plane on the opposite side thereof, each signal line of the "U" circuit being bonded to a corresponding signal line of the linear bus circuit.

8. A connection system according to claim 2 wherein there are a plurality of circuit boards arrayed in parallel in a frame cage assembly, each circuit board having ports on both sides of the board, and which boards have at least some of their ports connected to other ports of the boards in the frame cage assembly in a serial connection with a flat "S" cable circuit, and which boards have ports which are connected, in parallel, to ports of other boards by means of a flexible flat cable bus circuit to which said boards are connected by means of a "U" circuit and said cable bus having a flat flexible substrate and having a plurality of parallel signal lines formed on a top surface thereof, and which said "U" circuit having signal lines connected to said linear bus circuit and having tab end connections which are connected to ports of the boards in the circuit board array which enable said boards to connect to said bus circuit.

* * * * *

UNITED STATES PATENT AND TRADEMARK OFFICE
CERTIFICATE OF CORRECTION

PATENT NO. : 4,845,315

DATED : July 4, 1989

INVENTOR(S) : Herbert Stopper

It is certified that error appears in the above-identified patent and that said Letters Patent is hereby corrected as shown below:

Column 1, line 26, "4,878,341" should be --3,878,341--.

Column 1, line 38, "a" should be --as--.

Column 1, line 39, "pluraity" should be --plurality--.

Column 1, line 47, "such" should be --much--.

Column 1, line 61, "multilyaer" should be --multilayer--.

Column 2, line 28, "parllel" should be --parallel--.

Column 3, line 36, delete "the" (first occurrence) and substitute --to--.

Column 3, line 39, delete "the" (first occurrence)

Column 3, line 50, "predetermined" should be --predefined--.

Column 4, line 27, "thorugh" should be --through--.

Column 5, line 6, "of of" should be --of--.

Column 5, line 6, "and" should be --an--.

UNITED STATES PATENT AND TRADEMARK OFFICE
CERTIFICATE OF CORRECTION

PATENT NO. : 4,845,315

DATED : July 4, 1989

INVENTOR(S) : Herbert Stopper

It is certified that error appears in the above-identified patent and that said Letters Patent is hereby corrected as shown below:

Column 7, line 15, "line" should be --lines--.

Column 7, line 64, "and" (first occurrence) should be --the--.

Column 9, line 10, claim 1, "predetermined" should be --predefined--.

Signed and Sealed this

Fifteenth Day of May, 1990

*Attest:*

HARRY F. MANBECK, JR.

*Attesting Officer*  *Commissioner of Patents and Trademarks*